United States Patent [19]

Barker

[11] 4,366,463
[45] Dec. 28, 1982

[54] KEYBOARD

[75] Inventor: Stephen F. Barker, Huntington Beach, Calif.

[73] Assignee: Cooper Industries, Inc., Houston, Tex.

[21] Appl. No.: 266,288

[22] Filed: May 22, 1981

[51] Int. Cl.³ .............................................. H01C 10/00
[52] U.S. Cl. ................................ 338/69; 84/DIG. 7; 338/32 H
[58] Field of Search ...................... 338/69, 32 H, 32 R; 323/368; 324/251, 252; 340/365 L; 84/DIG. 7

[56] References Cited

U.S. PATENT DOCUMENTS

| | | | |
|---|---|---|---|
| 3,488,613 | 1/1970 | Marchetti | 340/365 L |
| 3,617,600 | 11/1971 | Ohno | 84/DIG. 7 X |
| 3,858,145 | 12/1974 | Sulich et al. | 338/32 H |
| 3,954,085 | 5/1976 | Nassimbene | 340/365 L X |

FOREIGN PATENT DOCUMENTS 960366  12/1974  Canada ............................ 340/365 L Primary Examiner—C. L. Albritton
Attorney, Agent, or Firm—Spensley, Horn, Jubas & Lubitz

[57] ABSTRACT

A data entry device durable enough to withstand the rigors of industrial type usage in which the electronic components are isolated from the external environment is described. The device comprises a molded elastomer keyboard matrix with thin stainless steel keypads. Embedded into the elastomer beneath the keys are small magnets. Solid state Hall-effect switches are mounted at a predetermined distance from the magnets and are separated from them by a magnetically permeable stainless steel sheet which forms part of the enclosure isolating the electronic components from the environment. Depressing one of the keys on the elastomer matrix moves its associated magnet toward the respective Hall-effect device, causing a change in current which may be sensed by other electronic components. Because of the elastomer material, the keys spring back when released.

12 Claims, 3 Drawing Figures

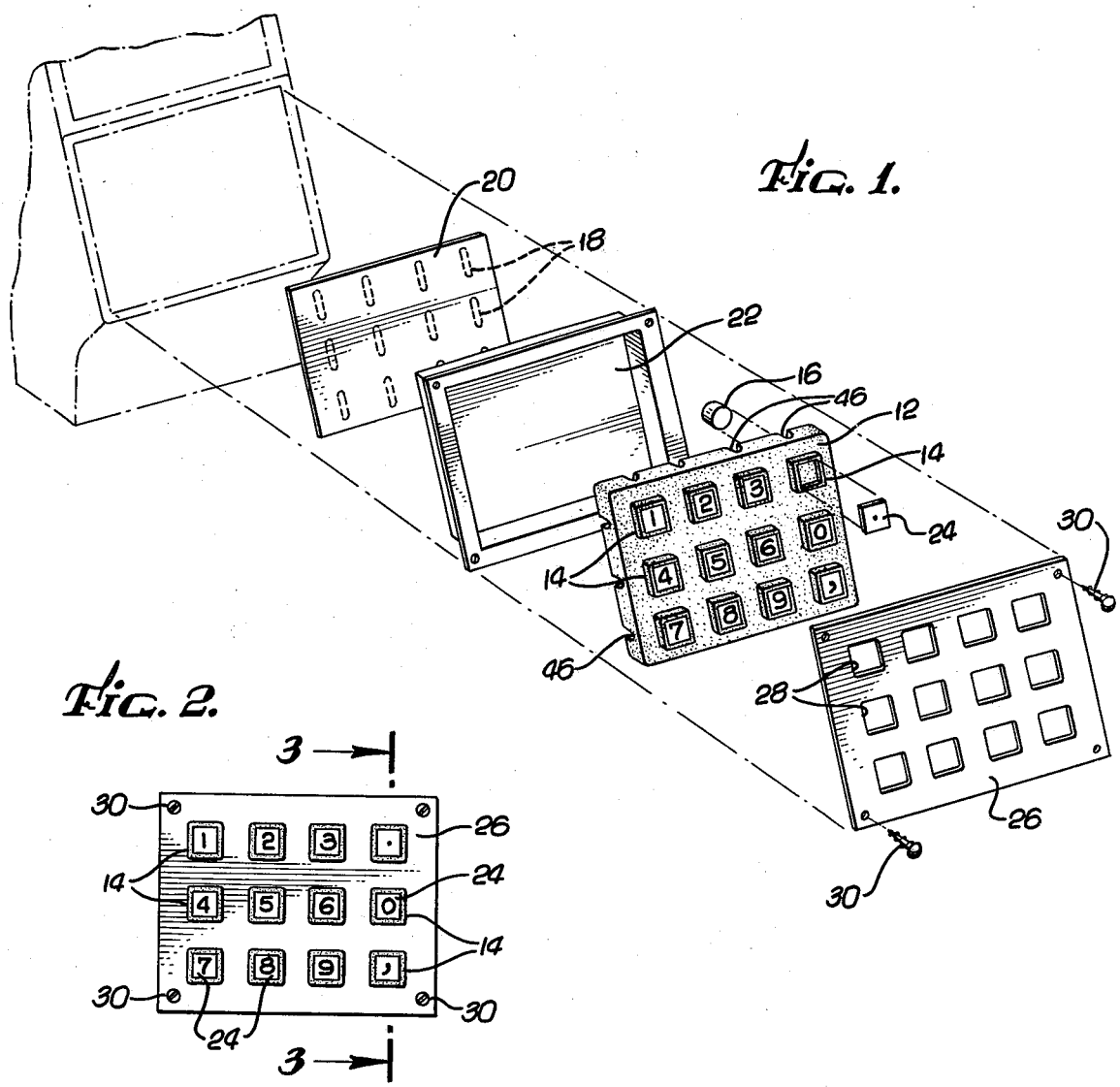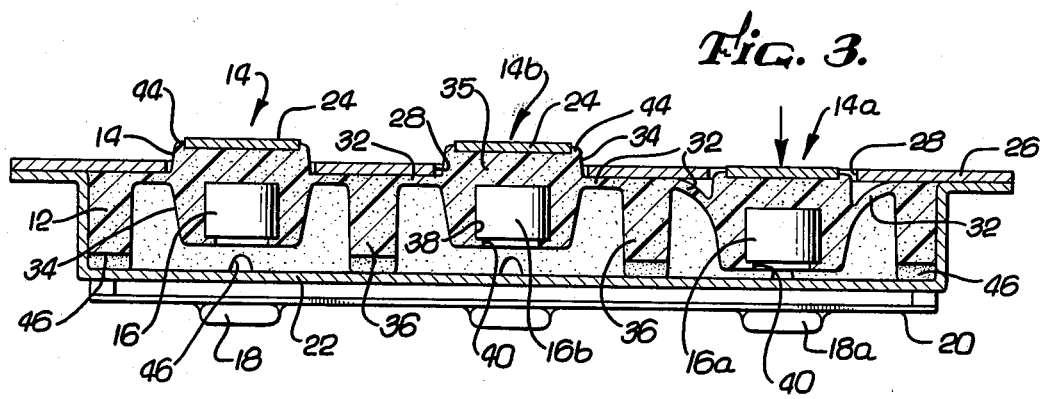

KEYBOARD

BACKGROUND OF THE INVENTION

1. Field of the Invention

This invention relates to the field of data entry devices for use in hostile environments.

2. Prior Art

Data entry devices such as keyboards must often be used in industrial settings where the environment may be hostile, such as in chemical plants, on offshore and land oil drilling rigs and in factories. In such settings, the device may be subjected to a variety of human and environmental abuses including volatile or corrosive gases, hazardous chemicals and high pressure water spray. A data entry device used in such an environment should therefore be durable and internally purgeable and should have its electronic components electrically isolated from the external atmosphere.

Prior art devices have included that disclosed in U.S. Pat. No. 3,448,419 issued to Myatt. In Myatt, reed switches are protected from adverse weather conditions by mounting them beneath a magnetically permeable plate. The reed switches are operated by permanent magnets attached to the end of spring-loaded keys whose shafts protrude through a mounting plate placed above the mgnetically permeable plate. Flexible bellows-like covers extend from the button of each key to the mounting plate in order to protect the springs, the shafts and the components beneath the mounting plate from exposure to weather conditions. However, if the flexible bellows-like cover surrounding the shaft and spring of any key becomes damaged, the mechanical and magnetic components not located beneath the magnetically permeable plate would be exposed to environmental conditions because of the presence of the hole in the mounting plate through which the shaft of the key must move. Further, it is believed that bellows-like covers are not only highly susceptible to accidental damage but prone to failure merely from repeated flexing. It is therefore not believed that the arrangement disclosed in Myatt is particularly suitable for use in a hostile industrial environment where not only resistance to weather conditions but durability despite physical and chemical abuse is necessary.

In U.S. Pat. No. 4,203,013 issued to Serras-Paulet, the use of magnetic Hall-effect semi-conductors as switches is suggested. Each of the suggested embodiments in Serras-Paulet uses keys having shafts which pass through apertures in a plate. In Serras-Paulet, a layer of magnetic rubber placed on the underside of the apertured plate is used to return the keys of the keyboard to their unpressed condition through the attraction of a magnet placed on the lower part of the key to the magnetic rubber layer. In the embodiment shown in FIG. 5 of that patent, a thin additional rubber sheet having a thicker portion located on top of the shaft of the key is used for fluid-tight sealing. This rubber layer is a layer separate from the magnetic rubber layer described previously and is used only to provide fluid-tight sealing. However, even in this embodiment, Serras-Paulet uses separate keys which pass through apertures in a plate.

In U.S. Pat. No. 3,750,062 issued to Goto, reed switches are mounted below the positions of a switch board and are operated by bringing a small magnet attached to the finger of the operator into contact with the switch board at the appropriate locations. The surface of the switch board, according to the patent, may be made of a substance such as rubber, plastic or cloth into which the magnet, attached to a finger of the operator, may be pressed in order that switching occur. Requiring that an operator key in data by the use of a magnet on the tip of the operator's finger is not appropriate in industrial type environments where the magnet may be lost or misplaced, or the operator may be wearing gloves.

Compared with the prior art devices discussed above, the present invention provides a data entry device of much simpler construction and of higher reliability when used in hostile environments. In the present invention, keys having springs and shaft susceptible to corrosive gases and liquids are eliminated, while the electronic components are mounted behind a magnetically permeable stainless steel plate which provides part of a fluid-tight enclosure around all the electronics. Even the magnets mounted beneath the keys of the present invention may be completely protected from the hostile conditions of an industrial environment by encasing them completely within the elastomer keyboard matrix.

SUMMARY OF THE INVENTION

One object of the present invention is to provide a data entry device for use in industrial environments where hostile physical and chemical conditions may exist, thereby necessitating that the electronic components of the device be protected from the environment.

The present invention therefore comprises a keyboard matrix molded of a single piece of elastomer material. The elastomer keyboard matrix is resistant to both the physical and the chemical abuse that may be present in an industrial environment. The use of elastomer results in a keyboard whose keys are shaftless and springless but which still have a certain spring or feel to them because of the elasticity of the material. Each key of the keyboard matrix has mounted beneath it a small permanent magnet which may be completely encased within the elastomer for protection. The permanent magnets are used to activate Hall-effect switches positioned beneath a stainless steel plate where they are physically and electrically isolated from the external environment. By pressing on a key of the keyboard matrix, the corresponding permanent magnet is brought into proximity with the associated Hall-effect device resulting in a change of electrical condition within the device. This change is sensed by other electronic components. The stainless steel plate does not prevent activation of the Hall-effect device since stainless steel is a magnetically permeable material.

Another object of the present invention is therefore to provide a data entry device resistent to the conditions existing in a hostile industrial environment that is of simple construction, that can seal against and maintain a 2-psig internal purge pressure, and can seal against high-pressure water spray from the outside. Hence it will be particularly noticed that the present invention provides a keyboard matrix which is fabricated from a single piece of elastomer material and which eliminates the use of shafts, springs and the like. Even the permanent magnets which are used to trigger the Hall-effect switches may be encased within the elastomer matrix. Thus, in the present invention, all the essential components which are particularly susceptible to damage from physical or chemical causes are either formed of, or encased within, the protective elastomer matrix or, in the case of the electronic components, protected within an internally purgeable enclosure having a magnetically permeable plate permitting magnetic switching to occur within the sealed enclosure. Another object of the present invention, to provide a more reliable data entry device, is thereby achieved.

DESCRIPTION OF THE DRAWINGS

FIG. 1 is an exploded perspective view of an embodiment of the data entry device of the present invention.

FIG. 2 is a front view of an embodiment of the present invention.

FIG. 3 is a cross-sectional view of the embodiment shown in FIG. 2 taken along the lines 3—3, with one key depressed.

DESCRIPTION OF THE INVENTION

Referring first to FIG. 1, which is an exploded perspective view of the data entry device of the present invention, the major features and components of the present invention may be seen. The data entry device comprises a single piece elastomer keyboard matrix 12 having raised keys 14 disposed in an array on its front surface. Attached to the lower part of each key is a small magnet 16 which is used to trigger Hall-effect switches 18 mounted on a printed circuit board 20. The printed circuit board 20 is mounted a predetermined distance from the underside of a stainless steel plate 22. For ease in positioning, stainless steel plate 22 has, preferably, on its upper surface a pocket into which the keyboard matrix 12 may be placed.

On the surface of each key 14 is placed a small stainless steel keypad 24 on which a number, letter, symbol or other indicium of the function of the corresponding key 14 can be placed. Holding the keyboard matrix 12 in place against the stainless steel plate 22 is, preferably, an aluminum bezel plate 26 having openings 28 through which the keys 14 with their keypads 24 may project. Screws 30 may be used to secure bezel plate 26 to the stainless steel plate 22 or some other part of the frame of the piece of equipment with which the data entry device is to be used.

The data entry device of the present invention is operated by pressing upon the appropriate keys 14. The elasticity of the keyboard matrix 12, which derives from the particular feature of its construction and its use of elastomer material as subsequently described, allows a key 14 and the small magnet 16 attached at its lower side to move toward the stainless steel plate 22 when pressed. The Hall-effect semiconductor device 18 corresponding to that key location thereby produces a signal which may be processed by other electronic components. Because the electronic components, including the Hall-effect switches 18, may all be placed within an environmentally sealed enclosure, the data entry device of the present invention is particularly adapted to use out of doors or in an industrial area. Moreover, the keyboard matrix 12 itself is of unitary construction and does not have shafts or springs while the magnets 16 may be completely encased within the keyboard matrix 12 so that even the parts external to the enclosed electronic components are resistant to environmental factors such as rain, salt air, or corrosive gases.

The structure of a preferred emodiment of the present invention may be described with reference to FIG. 3, which is a cross-sectional view of the invention as shown in FIG. 2. In the preferred embodiment described, the keyboard matrix 12 is constructed of an elastomer material. A suitable material for such purposes resistant to many environmental factors in neoprene having a hardness rating of 40 SDH. The keyboard matrix 12 comprises essentially square key areas 34 with thicker partitions 36 therebetween. A key area 34 is comprised of a thin peripheral area 32 surrounding a thicker raised key area 35. Beneath each raised key area 35 is a small cylindrical cavity 38 for holding a magnet 16. The thickened partitions 36 on each side of the key area 34 extend downward and are integrally formed from the molded elastomer. These partitions 36 serve to physically isolate the key action of each key 14 from adjacent keys 14 and to physically support the keyboard matrix 12. The thin peripheral areas 32 located between the partitions 36 and the raised key areas 35 in each key area 34 permit the keys 14 to move vertically when pressed due to the elasticity of the thin peripheral area 32. The elasticity of the peripheral area 32 also allows the key 14 to return to its original position after pressure is removed.

Each of the thickened partitions 36 is provided with openings 46 into the areas beneath the adjacent keys 14. Since the pressing of a key 14 tends to force the air trapped in the area beneath the key 14 out, the immediate return of the key 14 to its unpressed condition might be prevented if these openings 46 to assist air flow were not provided.

In the preferred embodiment, small rare-earth cobalt magnets 16 having a cylindrical shape are used. Each magnet 16 is sized so that it is approximately the same size as a cylindrical cavity 38 located beneath a key 14 of the keyboard matrix 12 and so that it may be inserted into such cavity 38 with its south pole facing in the direction toward the associated Hall-effect semiconductor device 18. It will be noticed that each cavity 38 has a narrow annular rim 40 on its opened side whose diameter has a radius slightly smaller than the radius of the cavity 38. In the present embodiment the radius of the annular rim 40 is approximately 0.030 inches less than the radius of the cylindrical cavity 38. The purpose of this annular rim 40 is to retain the cylindrical magnet 16 in place within the cavity 38. The elasticity of the material used to form the keyboard matrix 12 allows the magnet 16 to be placed within the cavity notwithstanding that its radius is greater than the radius of the annular rim 40. Once inserted into the cavity 38, the magnet 16 is retained therein by the annular rim 40. Preferably, the opening at the bottom of the cavity 38 may be closed with elastomer material after the magnet 16 has been inserted therein so as to completely protect the magnet 16 from environmental factors.

A thin lip 44 is integrally formed at the periphery of the raised key area 35 of each key 14. A small stiffened plate or keypad 24 may be installed on the top of the raised key area 35 so as to be pressed against by this lip 44. The lip 44 not only helps to position the keypad 24 on the raised key area 35 but also helps to hold keypad 24 in place through the action of lip 44 pressing on the sides of the keypad 24. Preferably, the keypad 24 is fabricated of 16 guage #316 stainless steel and is held in place by adhesive means bonding the keypad 24 to the upper surface of the raised section 35 as well as by the action of the lip 44 on the edges of the keypad 24. In addition to providing some lateral stiffening of the key 14, the keypad 24 indicates the function of the particular key 14 by having etched, embossed or marked thereon a number, a letter, a symbol or some other indicium of the function of the key 14. The keypads 24 could, however, be omitted if desired.

The keyboard matrix 12 is placed against the magnetically permeable plate or panel 22, which may be formed from stainless steel. This plate or panel 22 forms part of an enclosure which environmentally seals the electronic components from hostile conditions obtaining in the environment. On the inside surface of this plate or panel 22, a printed circuit board 20 containing solid state Hall-effect semiconductor devices 18 and their supporting electronic components is mounted below the keyboard matrix 12 so that a predetermined distance between the south pole of the magnet 16 embedded in the cavity 38 of the key 14 and the corresponding Hall-effect device 18 is maintained. There is one Hall-effect semiconductor device 18 mounted below and corresponding to each key 14. Other electronic components may be mounted within the enclosure, either on circuit board 20 or elsewhere, but are not shown in the figures.

Preferably, a pocket such as shown in FIGS. 1 and 3 is formed on the outside surface of the stainless steel panel 22 in order to assist in properly positioning the keyboard matrix 12. The bezel plate 26 may be used to hold the keyboard matrix 12 in place. The bezel plate 26 has apertures 28 which allow the raised key areas 35 of the keys 14 to project therethrough when the bezel plate 26 is placed over the keyboard matrix 12. Bezel plate 26 may be fabricated of aluminum and may be held in position by screws 30 joining bezel plate 26 to the stainless steel plate 22 or to some other part of the enclosure for the electronic components.

The operation of devices using the Hall-effect are well known and the details of their operation will not be described herein. The Hall-effect semiconductor devices 18 have the property or responding to a change in an external magnetic field by changing the current between two particular points within the device when the magnetic field and another current running through the device are properly oriented. In the present invention, a solid state Hall-effect switch commonly designated as UGN 3019T and marketed by Sprague may be used.

Thus, when a key 14a of the keyboard matrix 12 is depressed, such as is shown in FIG. 3 the corresponding permanent magnet 16a embedded beneath the key 14a is placed in closer proximity to the Hall-effect device 18a, resulting in an increase in magnetic flux density within the device 18a. This changes the current within the Hall-effect switch 18a. This change, or preferably the leading edge of this change, may be sensed by an electronic circuit, and appropriate signals produced in response thereto. For example, the change in the Hall-effect switch 18a may be sensed by TTL logic elements and the resulting TTL signal sent along a data bus to a CPU.

It will be noted that the above-described effect takes place notwithstanding the presence of the stainless steel panel 22 located between the permanent magnets 16 and the Hall-effect devices 18. This occurs because stainless steel is a magnetically permeable material whose effect on the magnetic field at the Hall-effect device is relatively small.

When the key 14a is released by the operator, it springs back to its original position due to the elasticity of the keyboard matrix 12, thereby returning the magnet 16a to its original position.

Notwithstanding that the entire keyboard matrix 12 of the present invention is fabricated from a single piece of elastomer material, the keys 14 can be independently operated. The relatively thick partitions 36 which separate adjacent keys 14 from one another and which also extend about the perimeter of the keyboard matrix 12 prevent the pressing down of one key 14 from producing a corresponding although perhaps smaller downward movement of any of the adjacent keys, which effect might result if the keyboard matrix 12 were an undifferentiated elastomer sheet. Instead, as seen in FIG. 3, one key 14a may be depressed placing its associated magnet 16a in proximity to the corresponding Hall-effect device 18a to produce a signal while the magnet 16b associated with the adjacent key 14b remains stationary. Thus, the particular structure of the keyboard matrix 12 results in a device inherently having operational reliability. Although the main function of the bezel plate 26 is to hold the keyboard matrix 12 in place, it will be seen that the bezel plate 26 also prevents the keyboard matrix 12 from being erroneously pressed in the area between keys 14, thus further enhancing the reliability of the invention.

While the presently preferred embodiment has been described with respect to a specific configuration, other configurations are of course within the scope of the present invention. For example, magnetic reed switches rather than Hall-effect switches may be employed on the printed circuit board beneath the stainless steel panel. As another example, the bezel plate 26 may be omitted if some other means of attaching the keyboard matrix 12 is employed. Also, various details of the keyboard matrix may be varied within the scope of the present invention, such as the placement or number of keys. As another example, the height of the raised area of the keys and the ratio of the areas of the thin portions to the areas of the raised portions may both be varied, in which case the amount of movement and the springiness of the keys could be affected if desired. Thus the invention is not intended to be limited to the particular embodiments specifically discussed hereinabove.

I claim:

1. A keyboard comprising:
   a one piece elastomer matrix forming a plurality of independently depressible keys;
   a magnet associated with and attached beneath each said depressible key;
   a switching means associated with each said depressible key and magnet located beneath said magnet for activation by the associated magnet when said depressible key is pressed; and
   a magnetically permeable means for segregating said matrix from said switching means.

2. A keyboard as in claim 1 wherein said switching means is a Hall-effect switch.

3. A keyboard as in claim 2 or 1 wherein the areas of said matrix immediately adjacent to each said key are formed of a relatively thin elastomer layer to enable said keys to be depressed and to spring back to their unpressed condition.

4. A keyboard as in claim 1 wherein said magnetically permeable means is a stainless steel plate.

5. A keyboard as in claim 2 or 1 wherein each said magnet is encased beneath its associated depressible key within said elastomer matrix.

6. A keyboard for use in hostile environments comprising:
   an integral keyboard section made of an elastomeric material, said keyboard section including a plurality of support members which define individual key spaces, a thickened key member located in each key space, and a flexible portion connecting each key member to its surrounding support members, whereby each key member is independently movable within its respective key space;

a magnetically permeable plate upon which said support members are placed;

a printed circuit board located on the side of the plate opposite the keyboard section;

a magnet attached to each key member and movable in conjunction therewith; and a plurality of magnetic switches mounted on said printed circuit board, each said magnetic switch being mounted opposite a different magnet, whereby each said switch may be activated by bringing its associated magnet into proximity with the switch by depressing the key member connected to said magnet.

7. A keyboard comprising:

a matrix formed from a single piece of elastomer material having key areas separated from one another by integral thick elastomer partitions, said key areas comprising relatively thick center areas forming keys and relatively thin peripheral elastomer layers surrounding said center areas so that said keys are depressible;

a magnet located beneath each said key and embedded in said elastomer material of said matrix;

a magnetic switch associated with each said magnet for actuation by said magnet when said magnet is brought near to said switch;

whereby when a said key is depressed the corresponding magnetic switch is actuated.

8. The keyboard of claim 7 wherein said magnetic switch is a Hall-effect switch.

9. The keyboard of claim 7 wherein a thin magnetically permeable plate separates said magnetic switches from said matrix.

10. The keyboard of claim 9 wherein said plate is stainless steel.

11. The keyboard of claim 1 or 7 further comprising thin stiffened members attached to the top surfaces of said keys as keypads.

12. The keyboard of claim 6 wherein each key member has a cavity formed therein, and wherein each magnet is located within a cavity.

* * * * *